(12) United States Patent
Fitzgerald

(10) Patent No.: US 6,291,321 B1
(45) Date of Patent: Sep. 18, 2001

(54) CONTROLLING THREADING DISLOCATION DENSITIES IN GE ON SI USING GRADED GESI LAYERS AND PLANARIZATION

(75) Inventor: Eugene A. Fitzgerald, Windham, NH (US)

(73) Assignee: Massachusetts Institute of Technology, Cambridge, MA (US)

(*) Notice: Subject to any disclaimer, the term of this patent is extended or adjusted under 35 U.S.C. 154(b) by 0 days.

(21) Appl. No.: 09/265,016

(22) Filed: Mar. 9, 1999

Related U.S. Application Data

(62) Division of application No. 09/103,672, filed on Jun. 23, 1998, now Pat. No. 6,107,653
(60) Provisional application No. 60/059,765, filed on Sep. 16, 1997, and provisional application No. 60/050,602, filed on Jun. 24, 1997.

(51) Int. Cl.[7] ................................ H01L 21/20
(52) U.S. Cl. ........................................ 438/494
(58) Field of Search ........................ 438/493, 494, 438/497, 498, 500, 503, 504, 507, 933, 938, 474, 476

(56) References Cited

U.S. PATENT DOCUMENTS

| | | | |
|---|---|---|---|
| 4,997,776 | * 3/1991 | Harame et al. | 438/313 |
| 5,177,583 | 1/1993 | Endo et al. | 257/190 |
| 5,250,445 | * 10/1993 | Bean et al. | 438/474 |
| 5,298,452 | 3/1994 | Meyerson | 437/81 |
| 5,399,522 | 3/1995 | Ohori . | |
| 5,442,205 | 8/1995 | Brasen et al. . | |
| 5,534,713 | 7/1996 | Ismail et al. | 257/24 |
| 5,630,905 | 5/1997 | Lynch et al. | 438/507 |
| 5,659,187 | 8/1997 | Legoues et al. | 257/190 |
| 5,714,777 | 2/1998 | Ismail et al. | 257/263 |
| 5,891,769 | 4/1999 | Liaw et al. | 438/167 |
| 5,906,951 | 5/1999 | Chu et al. | 438/751 |

FOREIGN PATENT DOCUMENTS

| | | |
|---|---|---|
| 0 514 018 A2 | 4/1992 | (EP) . |
| 2 701 599 | 9/1993 | (FR) . |

OTHER PUBLICATIONS

Currie et al., "Controlling Threading Dislocation in Ge on Si Using Graded SiGe Layers and Chemical–Mechanical Polishing," vol. 72 No. 14, p. 1718–1720, Feb. 1998.

* cited by examiner

*Primary Examiner*—Keith Christianson
(74) *Attorney, Agent, or Firm*—Samuels, Gauthier & Stevens, LLP

(57) ABSTRACT

A semiconductor structure including a semiconductor substrate, at least one first crystalline epitaxial layer on the substrate, the first layer having a surface which is planarized, and at least one second crystalline epitaxial layer on the at least one first layer. In another embodiment of the invention there is provided a semiconductor structure including a silicon substrate, and a GeSi graded region grown on the silicon substrate, compressive strain being incorporated in the graded region to offset the tensile strain that is incorporated during thermal processing. In yet another embodiment of the invention there is provided a semiconductor structure including a semiconductor substrate, a first layer having a graded region grown on the substrate, compressive strain being incorporated in the graded region to offset the tensile strain that is incorporated during thermal processing, the first layer having a surface which is planarized, and a second layer provided on the first layer. In still another embodiment of the invention there is provided a method of fabricating a semiconductor structure including providing a semiconductor substrate, providing at least one first crystalline epitaxial layer on the substrate, and planarizing the surface of the first layer.

17 Claims, 5 Drawing Sheets

| | SAMPLE A | SAMPLE B | SAMPLE C | SAMPLE D |
|---|---|---|---|---|
| FINAL Ge COMPOSITION | 100% | 100% | 50% | 100% |
| GRADING RATE (% Ge $\mu m^{-1}$) | 5 | 10 | 10 | 10 |
| TOTAL EPITAXIAL THICKNESS ($\mu m$) | 23 | 12 | 6.5 | 12 |
| GROWTH TEMPERATURE (°C) | 750 | 800 | 750 | 50-76%: 750<br>76-100%: 550 |
| GROWTH PRESSURE (mT) | 25 | 50 | 25 | 50-76%: 25<br>76-100%: 3 |
| CMP AT 50% | NO | NO | — | YES |
| THREADING DISLOCATION DENSITY ($cm^{-2}$) | $1 \pm 0.1 \times 10^7$ | $1-5 \times 10^7$ | $6.3 \pm 0.1 \times 10^6$ | $2.1 \pm 0.2 \times 10^6$ |
| CRACK DENSITY ($cm^{-1}$) | $47 \pm 5$ | 0 | 0 | 0 |
| PARTICLE DENSITY ($cm^{-2}$) | $1250 \pm 100$ | $600 \pm 40$ | $50 \pm 5$ | $150 \pm 10$ |
| RMS ROUGHNESS (nm) | 35.9 | 47 | 37.3 | 24.2 |
| $a_\perp$ OF TOP LAYER (Å) | 5.6559 | 5.6558 | 5.5327 | 5.6597 |
| $a_\parallel$ OF TOP LAYER (Å) | 5.6559 | 5.6552 | 5.5352 | 5.6409 |

GROWTH PARAMETERS AND CHARACTERIZATION RESULTS OF SAMPLES A-D

FIG. 2

CONTROLLING THREADING DISLOCATION DENSITIES IN GE ON SI USING GRADED GESI LAYERS AND PLANARIZATION

PRIORITY INFORMATION

This application is a Division of Ser. No. 09/103,672, filed Jan. 23, 1998 now 6,107,653, and also claims priority from provisional applications Ser. No. 60/050,602 filed Jun. 24, 1997 and Ser. No. 60/059,765 filed Sep. 16, 1997.

BACKGROUND OF THE INVENTION

The invention relates to a method of creating flat, crack-free low-dislocation-density mismatched semiconductor layers, and of controlling threading dislocation densities in Ge on Si using graded SiGe layers.

The progression of electronic and optoelectronic components and systems is creating a need for more complex system-level functions to be incorporated at the chip level. One of the effects of this demand is to bring ever-increasing pressure to use materials that are not lattice-matched to common substrates.

The technological significance of a totally miscible GeSi system has been well documented. In particular, relaxed graded GeSi buffers have been used as "substrates" for the growth of high electron mobility structures and for the integration of III–V devices on Si. The relaxed graded buffer introduces a 4% lattice mismatch between Si and Ge gradually, resulting in a disperse, three-dimensional misfit dislocation network. Strain-relieving glide of threading dislocations is facilitated, preventing the accumulation of mismatch strain. Because threading dislocations present in the initial layers can also be used to relieve strain in subsequent layers, the nucleation of additional dislocations is suppressed as the graded layer growth progresses. However, a complication arises during thick grades to high Ge concentrations.

The characteristic crosshatch surface roughness and the underlying strain fields of the misfit array can overlap, blocking threading dislocation glide and leading to dislocation pile-ups. The formation of these pile-ups necessitates the nucleation of additional threading dislocations, as the trapped threading dislocations can no longer contribute to strain relief. Growth on offcut Si substrates has been shown to improve surface morphology and decrease the number of pile-ups, but not eliminate them entirely. Therefore, an increase in threading dislocation density and the number of pile-ups is always observed as the thickness of graded layers increases.

SUMMARY OF THE INVENTION

It is therefore an object of the invention to provide a process that allows controlled relaxation of mismatched semiconductor layers so that many different semiconductor materials can be created on common substrates.

It is another object of the invention to provide a method utilizing planarization such as with chemical-mechanical polishing (CMP) which allows for the growth of relaxed graded buffers to 100% Ge without the concomitant increase in threading dislocation density.

It is yet another object of the invention to provide modifications to ultra-high vacuum chemical vapor deposition (UHVCVD) growth procedures which eliminate surface cracks due to the thermal mismatch between Si and Ge and particulate defects due to gas phase nucleation events.

Accordingly, one embodiment of the invention provides a semiconductor structure comprising a semiconductor substrate, at least one first crystalline epitaxial layer on the substrate, the first layer having a surface which is planarized, and at least one second crystalline epitaxial layer on the at least one first layer.

In another embodiment of the invention there is provided a semiconductor structure comprising a silicon substrate, and a GeSi graded region grown on the silicon substrate, compressive strain being incorporated in the graded region to offset the tensile strain that is incorporated during thermal processing.

In yet another embodiment of the invention there is provided a semiconductor structure comprising a semiconductor substrate, a first layer having a graded region grown on the substrate, compressive strain being incorporated in the graded region to offset the tensile strain that is incorporated during thermal processing, the first layer having a surface which is planarized, and a second layer provided on the first layer.

In still another embodiment of the invention there is provided a method of fabricating a semiconductor structure comprising providing a semiconductor substrate, providing at least one first crystalline epitaxial layer on the substrate, and planarizing the surface of the first layer.

BRIEF DESCRIPTION OF THE DRAWINGS

FIG. 2 is a table of growth parameters and characterization results of exemplary structure samples in accordance with the invention;

DETAILED DESCRIPTION OF THE INVENTION

Figure 1:
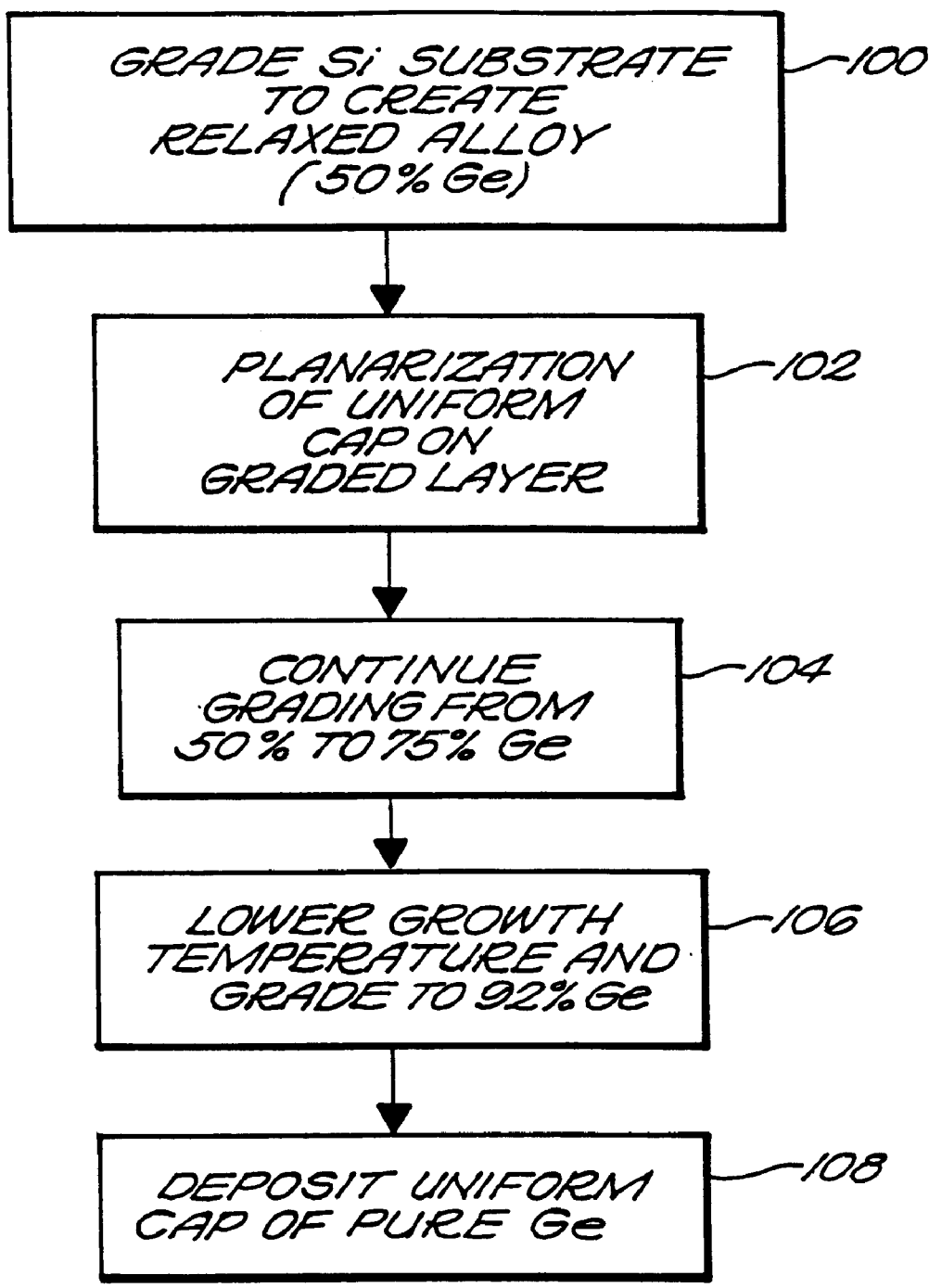
FIG. 1 is a flowchart of processing steps of an exemplary experiment in accordance with the invention.

It has been previously shown that although composition-graded GeSi layers are a viable means to relax GeSi alloys on Si for concentrations <50%, there is a rise in threading dislocation density with continued grading. See, for example, U.S. patent application Ser. No. 08/806,741 filed by Fitzgerald et al., incorporated herein by reference. Thus, despite the fact that, for example, a final Ge layer has a lower defect density than Ge grown directly on Si, the residual defect density is still too high for many applications ($^{18}10^7$ cm$^{-2}$), and the density is certainly greater than relaxed Ge$_{30}$S$_{70}$ on Si using this method ($\sim 7 \times 10^5$ cm$^{-2}$). The grading rate for such defect densities in Ge$_{30}$Si$_{70}$ is 10% Ge per micron of thickness.

In order to reach the desired goal of lower threading dislocation density, the grading rate is decreased to 5% Ge per micron of thickness. From experience, a lower grading rate will lower the threading dislocation density. However, it was found that the threading dislocation density was nearly equivalent to the 10% Ge/micron grading rate, cracks developed due to the thermal mismatch strain, and many particles were found due to what is believed to be gas-phase nucleation of GeSi since germane cracks at much lower temperatures than silane.

The major problems that need to be controlled in the semiconductor structure are the cracking and the threading dislocation density. Cracking is due to the fact that at 5% Ge per micron, the final thickness is very great, and upon cooling from the growth temperature, the thermal mismatch between the deposited layers and Si results in a tensile strain. When the tensile strain is great enough, cracking is the relaxation mechanism, especially if dislocation flow ceases at some temperature during cooling. However, lowering the threading dislocation density requires a greater thickness, since the slower grading rate reduces the threading dislocation density. Thus, it would appear that the removal of cracks and the presence of a low number of threading dislocations are incompatible goals.

A solution is found in the development of these relaxed structures. The need for very gradual grading as one tries to produce relaxed Ge structures with high Ge concentration has its origins in work-hardening in the graded buffer layer; i.e., during continued relaxation, dislocations are blocked by some mechanism in the highly dislocated graded layer, creating the need for the nucleation of more dislocations, and thereby increasing the threading dislocation density. For 10% Ge per micron grading rates, dislocation strain fields themselves can not possibly explain the blocking phenomenon. It has been concluded that the effect of dislocation strain fields on surface morphology aided the blocking of the dislocation motion. In fact, growth on an offcut wafer shows that such a blocking phenomenon can be decreased, and this experimental evidence supports the hypothesis that the surface roughness is the main issue.

The invention, therefore, applies a planarization step within the growth of the buffer layer to remove the roughness created by the dislocations introduced during relaxation; i.e., the process effectively removes the "history" of the surface by planarization, preventing the continued roughening and grooving of the surface that leads to dislocation blocking. A drastic effect is found: the rise in threading dislocation density as one continues to grade can be completely eliminated.

FIG. 1 is a flowchart of processing steps of an exemplary experiment in accordance with the invention. A summary of the exemplary experiment is as follows:

Initially (step 100), a Si substrate is graded at 10% Ge per micron to $Ge_{50}Si_{50}$ to create a relaxed alloy for exploring the growth at the high-Ge end which was problematic. This grading rate was not lowered since there was only a need to explore the high-Ge end. These layers were grown at 750° C. using UHVCVD. Defect analysis shows that a threading dislocation density on the order of $6 \times 10^6$ cm$^{-2}$ is achieved, exactly what was expected. Also, a number of dislocation pile-ups are found, which indicate that dislocation blocking has begun, but is not totally out of control.

These $Ge_{50}Si_{50}$ wafers had a 2 micron uniform cap on top of the graded layer so that planarization in the form of chemo-mechanical polishing (CMP) can be performed (step 102). It will be appreciated by those of skill in the art that other methods of planarization will also work, such as ion-beam etching or other planarization etching techniques. The CMP process used is the standard CMP in the Si industry, used for polishing Si wafers as well as planarizing back-end Si processes.

After planarization, the wafers are inserted back into the UHVCVD system and grading is continued (i.e. regrowth) (step 104). Deposition is started at the $Ge_{50}Si_{50}$ composition, and graded at 10% Ge per micron to 75% Ge, all at a growth temperature of 750° C.

The growth temperature is then lowered to 550° C. Then grading to 92% Ge occurs, at 10% Ge per micron (step 106).

A uniform cap of pure Ge is deposited, with 1–1.5 micron in thickness (step 108). This particular experiment has doping in the Ge cap so that Ge photodetectors can be fabricated.

The following description presents exemplary experimental samples which, for purposes of illustration, have been labeled as samples A, B, C and D. The control sample in this experiment, sample A, was graded from Si to 100% Ge at a rate of 5% Ge $\mu m^{-1}$. It was grown at 750° C. and 25 mT and topped with a 3 $\mu m$ Ge cap. A linear grade was approximted by increasing the Ge concentration in 2.5%, 5000 Å steps. Sample B was graded to 100% Ge at a rate of 10% Ge $\mu m^{-1}$, at a temperature of 800° C., and at a pressure of 50 mT. This structure corresponds to the sample structure from previous reports on the formation of dislocation pile-ups. Sample C was grown to only 50% Ge at a grading rate of 10% Ge $\mu m^{-1}$ and topped with a 1.5 $\mu m$ 50% Ge cap. The graded region of sample C was composed of 2% Ge, 2000 Å jumps.

Nine wafers were produced in this fashion to produce 50% Ge "virtual substrates" on Si for studying the threading dislocation density increase that occurs when grading to high Ge concentrations. Although not optimized for minimum threading dislocation densities, these "substrates" are known to typically possess threading dislocation densities of approxiamtely $5 \times 10^6$ cm$^{-2}$. As the table of FIG. 2 shows, the nine wafers were fine virtual substrates for this study with dislocation densities on this order.

Figure 3:
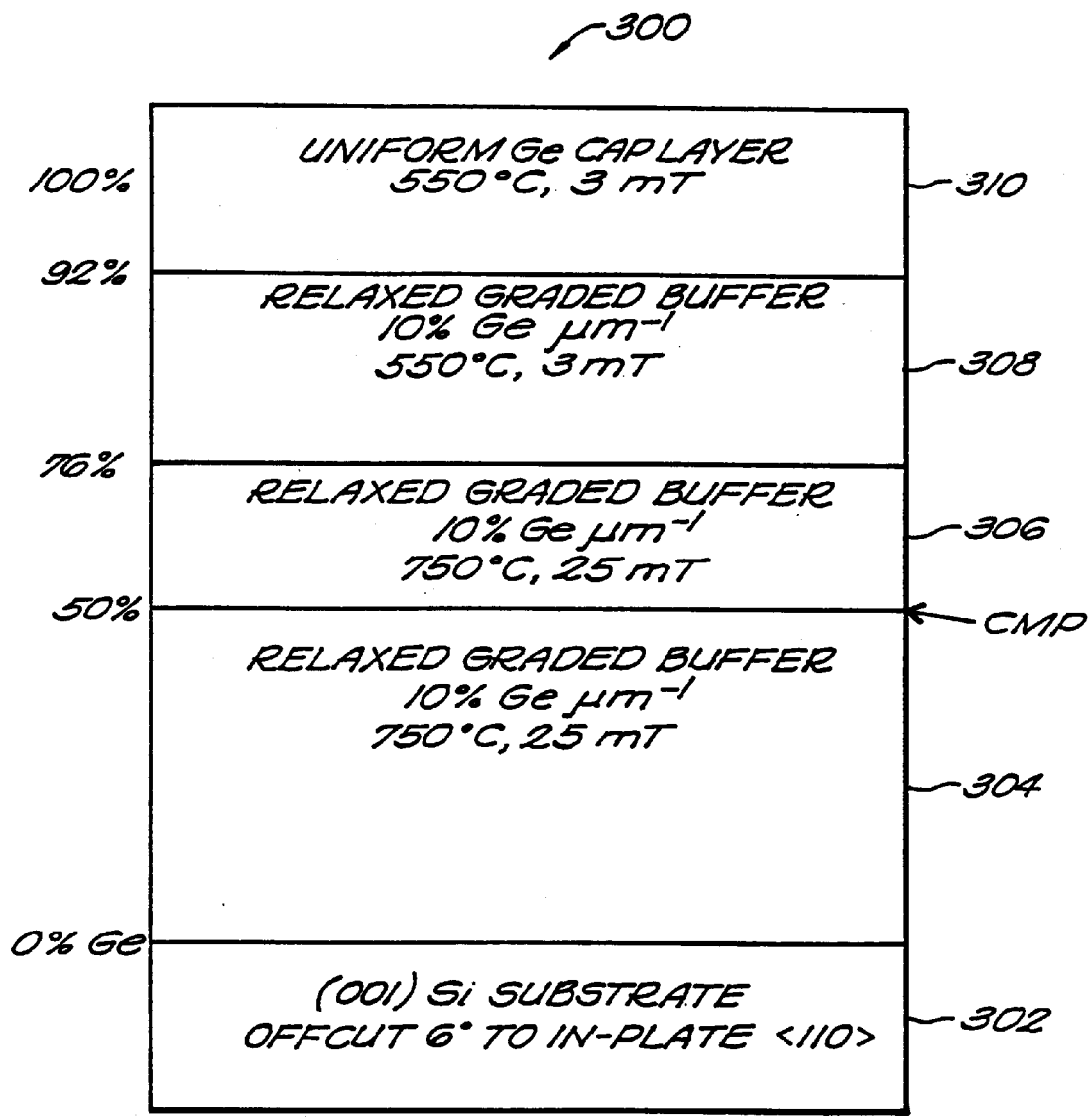
FIG. 3 is a schematic representation of structure and growth conditions for a semiconductor structure in accordance with the invention.

FIG. 3 is a schematic representation of structure and growth conditions for a semiconductor structure 300 (sample D) in accordance with the invention. The structure 300 includes a (001) Si substrate 302 offcut 6° to in-plane <110>. The structure 300 was grown to include a relaxed graded buffer layer or region 304 of only 50% Ge at a grading rate of 10% Ge$\mu m^{-1}$ and topped with a 1.5 $\mu m$ 50% Ge cap. The graded region was composed of 2% Ge, 2000 Å jumps. To this point, the structure corresponds to sample C described heretofore. The top 5000 Å of region 304 was then removed via CMP, and a 50–100% Ge graded buffer region 306 was grown on top at a rate of 10% Ge $\mu m^{-1}$, again in 2%, 2000 Å steps. It will be appreciated by those of skill in the art that the initiation of a second graded layer is accomplished by first growing a lattice-matched homoepitaxial uniform composition buffer layer before grading is initiated. In this 50–76% Ge portion, the growth conditions were held constant at 750° C. and 25 mT. Thereafter, the growth was halted and the temperature and pressure were lowered to 550° C. and 3 mT. The growth of a graded buffer region 308 then continued until a Ge concentration of 92% was reached. The final jump in Ge concentration was made from 92% to 100% and a 1.5 $\mu m$ uniform cap layer 310 was deposited.

Figure 4:
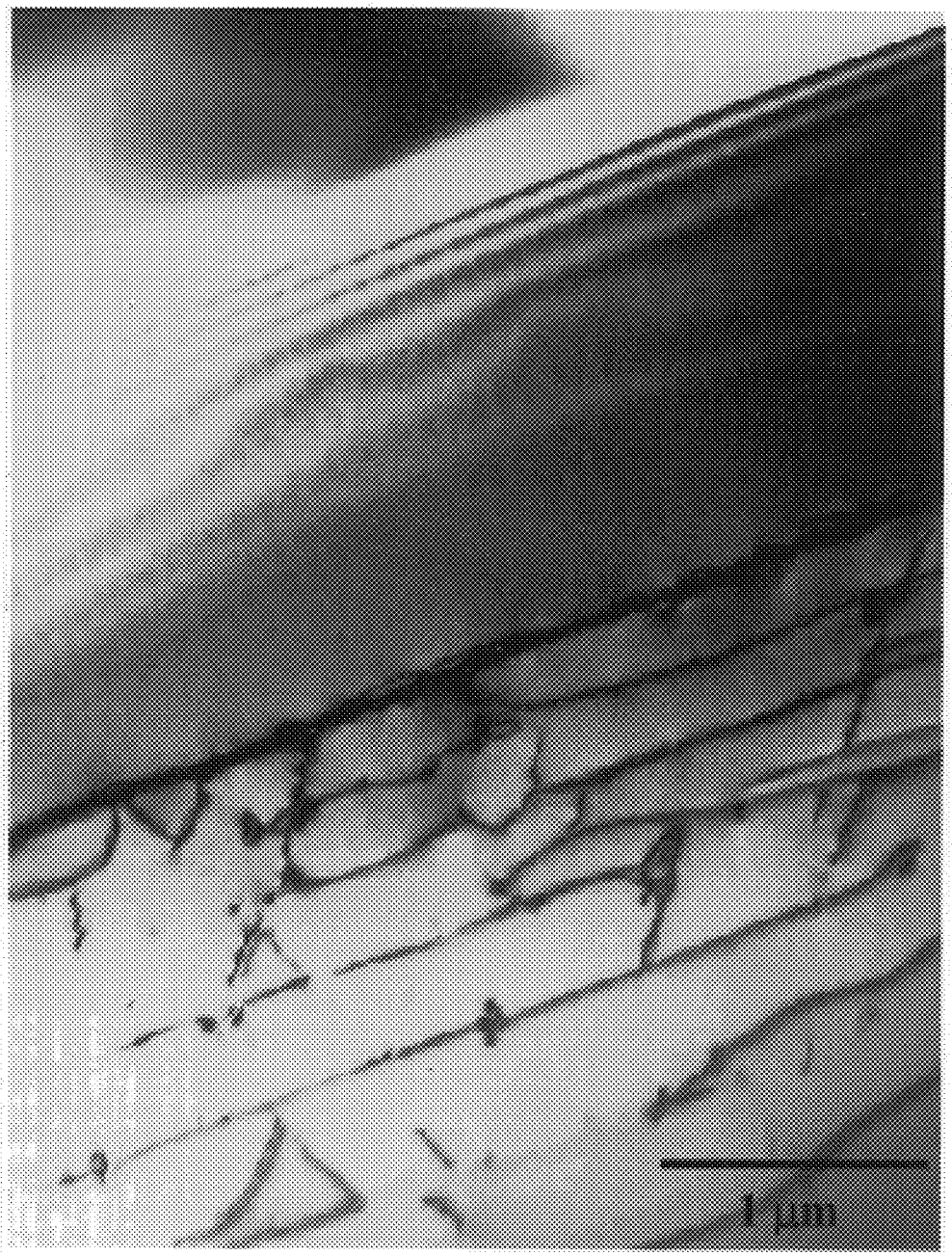
FIG. 4 is a cross-sectional XTEM image of the upper graded region and uniform Ge cap of the structure of the invention.

FIG. 4 is a cross-sectional transmission electron microscope (XTEM) micrograph of the upper graded region and the uniform cap of structure 300 (sample D). All of the samples in the study were grown on (100) Si wafers offcut 6° to the in-plane <110> by UHVCVD.

The four samples were characterized via cross-sectional XTEM, plan view optical microscopy, etch-pit density (EPD), atomic force microscopy (APM), and triple-axis X-ray diffraction. The relevant results are presented in the table of FIG. 2.

When comparing the threading dislocation densities of the four samples A, B, C and D, both expected and unexpected results are found. Since sample A was grown at a slow grading rate, one would expect it to have a low threading dislocation density if one does not consider the deleterious effects of surface roughening and pile-up formation. Of course, as shown in the previous work, these factors create a high density of threading dislocations, ~$10^7$ cm$^{-2}$. As expected, sample B, a similar sample graded at a faster rate of 10% Ge $\mu$m$^{-1}$ to 100% Ge, has an even larger threading dislocation density. The sample C data also confirms the threading dislocation density increase with Ge concentration—at 50% Ge, the threading dislocation density is already in the $10^6$ cm$^{-2}$ range.

However, the structure 300 (sample D), in effect a grade to 100% at 10% Ge $\mu$m$^{-1}$, has a similar or even slightly lower threading dislocation density than the sample C—a lower value than that of both sample A and sample B. The addition of the CMP step at 50% Ge has arrested the increase in threading dislocation density with Ge concentration. Hence, the planarization of the surface during this step must free the threads seen in pile-ups in sample C, and allow the dislocations to relieve the stain introduced in the subsequent growth, eliminating the driving force for the nucleation of additional threading dislocations.

Figure 5A:
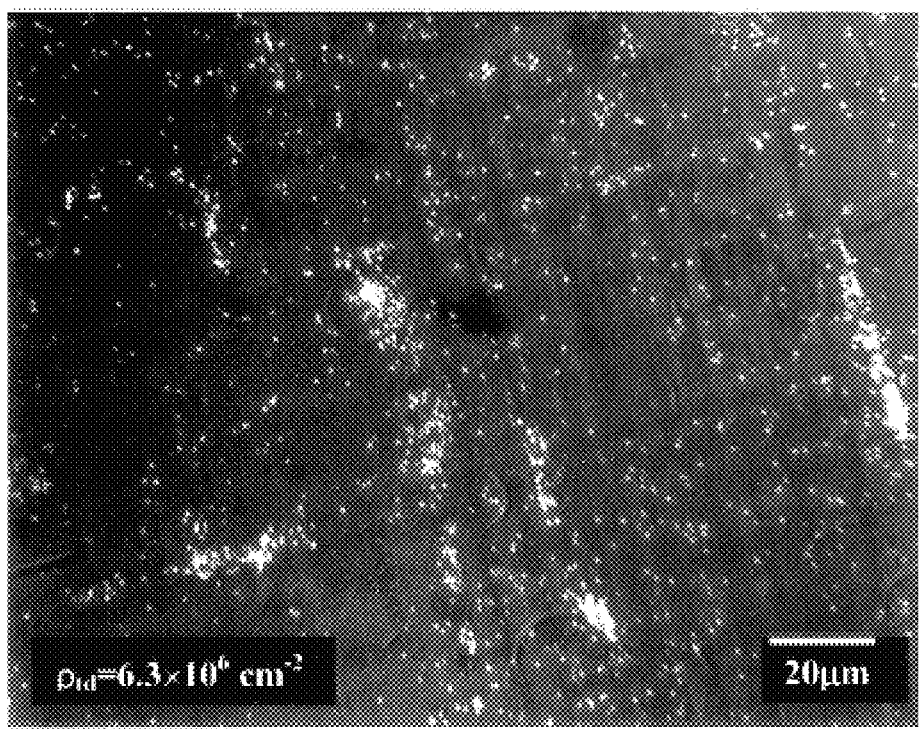
FIGS. 5A and 5B are Nomarski optical micrographs comparing the EPD of exemplary semiconductor structure samples, respectively.
Figure 5B:
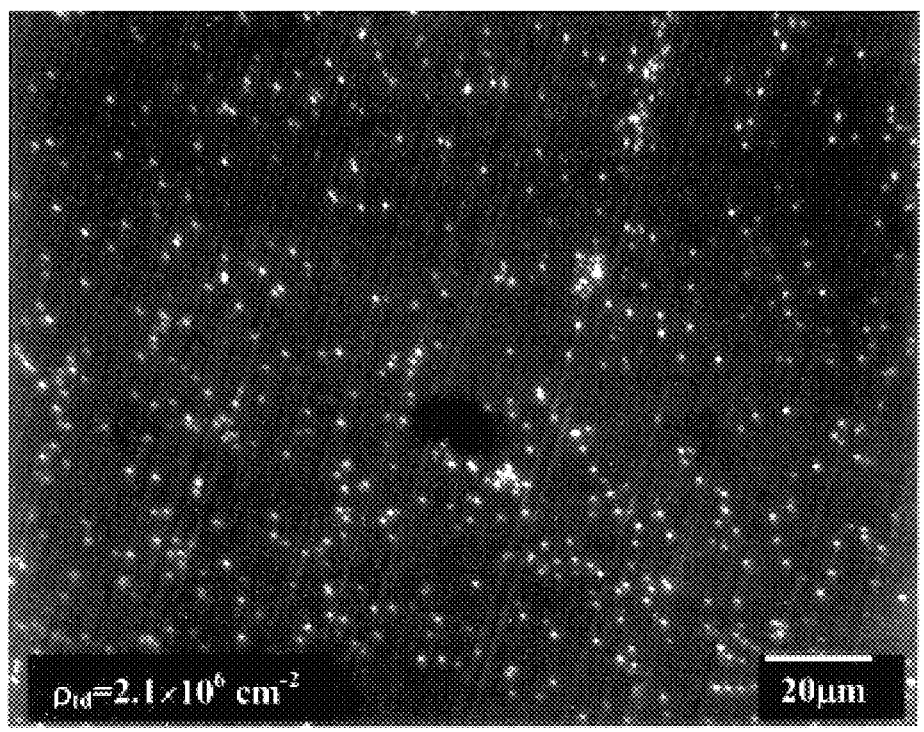

Nomarski optical micrographs comparing the EPD of samples C and D are shown in FIGS. 5A and 5B, respectively. The EPD results indicate threading dislocation densities in sample C, the 10% Ge $\mu$m$^{-1}$ grade to 50% Ge, and sample D, the 10% Ge $\mu$m$^{-1}$ grade to 100% Ge grown on sample B after a CMP planarization step. The threading dislocation densities are 6.3±0.1×$10^6$ cm$^{-2}$ for sample C, and 2.1±0.2×$10^6$ cm$^{-2}$ for sample D.

It will be appreciated that the pile-ups seen in sample C have been eliminated by the CMP/regrowth step and no substantial pile-ups are seen in sample D. A remarkable observation is that the overall defect morphology is actually improved with further relaxation. It is postulated that when the initial portion of growth is optimized to further decrease its baseline threading dislocation density, the growth of relaxed graded GeSi buffers to 100% Ge with much lower final defect densities will be achieved.

By examining the AFM data from the four samples, the influence of surface roughness on threading dislocation density is recognized. Sample B, the 10% Ge $\mu$m$^{-1}$ grade to 100% Ge, has the highest rms roughness, 47 nm. The high surface roughness is due to the fast grading rate, creating the highest threading dislocation density of the four samples—well over $10^7$ cm$^{-2}$. When the grading rate is decreased to 5% Ge $\mu$m$^{-1}$ for sample A, a corresponding decrease in surface roughness to 35.9 nm is observed. This roughness is on par with that of sample C and large enough to create pile-ups and increased threading dislocation density in both samples. With the inclusion of the CMP step in sample D, the resulting final surface roughness, 24.2 nm, is much lower than that of sample B despite the same grading rate, and lower than that of the more slowly graded sample A. This result is a parallel observation to the threading dislocation density data discussed previously, and it emphasizes the importance of the inclusion of a CMP step in thick graded buffer growth.

When a thick graded SiGe buffer like sample A is grown at high temperatures, cracks in the surface can result during cooling due to the thermal mismatch between Si and Ge. Between the sample A growth temperature of 750° C. and room temperature, the thermal expansion coefficient of Si, $\alpha_{Si}$, varies from 4.27×$10^{-6}$ K$^{-1}$ to 2.57×$10^{-6}$ K$^{-1}$ and $\alpha_{Ge}$ varies from 8.55×$10^{-6}$ K$^{-1}$ to 5.90×$10^{-6}$ K$^{-1}$. Because the coefficient of thermal expansion of Ge is greater than that of Si, severe tensile stresses can result in the upper Ge-rich portion of the buffer.

In sample A, the calculated strain due to thermal mismatch when cooling to room temperature is 2.6×$10^{-3}$, resulting in a high density of surface cracks. When growing sample D, growth modifications specifically designed to alleviate this cracking problem are added. By grading at twice the rate, the total amount of deposited material and the strain energy from the thermal stress accordingly is decreased. More importantly, the fast grading rate at lower temperature and the final Ge concentration jump in sample D, from 92% to 100%, incorporate metastable compressive residual stress into the buffer at the growth temperature. Since the compressive lattice mismatch opposes the tensile thermal mismatch, sample D is left in a nearly stress-free state at room temperature.

The X-ray diffraction data indicates that the top layer is actually slightly compressive, preventing any surface cracking. Additionally, due to the large final jump in Ge concentration, the graded buffer of sample D has nearly 1 $\mu$m less Ge-rich material than sample B, decreasing its absolute value of strain energy from thermal mismatch stress. Hence, even though neither sample D nor sample B experienced surface cracking after growth, sample D will be the superior substrate for subsequent integration of III–V materials which are also thermally mismatched to Si. The lower growth temperature during the high Ge portion of sample D also decreased the amount of particulate contamination from gas phase nucleation events. These events occur much more frequently as the growth temperature and pressure increase, particularly near the melting point of the solid alloy.

By including a planarization step in the graded buffer growth process, and by making several growth modifications, a 100% Ge graded buffer has been grown at 10% Ge $\mu$m$^{-1}$ that exhibits a final threading dislocation density an order of magnitude lower than that of sample A, the 5% Ge $\mu$m$^{-1}$ grade with no planarization step. Additionally, the nucleation of threading dislocations in the 50–100% Ge portion of the growth has been suppressed through the release of immobile dislocations located in dislocation pile-ups. The surface morphology of the graded buffer has also been improved. Finally, surface cracking due to the thermal mismatch between Si and Ge and particles due to gas phase nucleation events have both been eliminated. These growth modifications not only allow for obtaining higher quality Ge on Si, but also suggest a strategy for the growth of Ge on Si with lower defect densities on the order of bulk Ge substrates.

In general, the previous knowledge of the low-Ge-concentration alloys is now combined with the newly observed properties of films grown to higher Ge concentrations as discussed above. Since threading dislocation densities for Ge$_{30}$Si$_{70}$ graded at 10% per micron are in the low $10^5$ cm$^{-2}$ range, a combination of optimal conditions for the low and high Ge concentration can lead to very low threading dislocation density, pure Ge-coated Si wafers with $10^5$ cm$^{-2}$ threading dislocation density. GaAs can subsequently deposited on Ge, creating III–V material monolithically integrated to Si.

The invention thus provides a method of producing low threading dislocation density by using planarization steps within the graded buffer. The invention essentially involves growing one lattice-mismatched semiconductor on another, planarizing the semiconductor growth, and regrowing a semiconductor on the polished surface, and continuing to grow a lattice-mismatched structure that continues to relax. In addition, the growth temperatures are reduced at the high Ge end to balance the thermal expansion difference between Ge and Si by trapping a residual amount of opposite-sign lattice mismatch.

An optimum structure is configured as described above. An alternative exemplary embodiment of a semiconductor structure is configured as follows. Initially, the structure is graded to Ge at 5%/micron at 750° C. The surface is then planarized by, for example, CMP. Next, one would regrow and grade to $Ge_{75}Si_{25}$ at 650° C. Thereafter, the surface is again planarized by CMP. Finally, the structure is regrown and graded to uniform Ge at 550° C.

Although the foregoing description reports these particular sequences, it is noted that small variations to this sequence may produce the same results, and the optimum number of planarization steps may vary. It is clear that at least one planarization step in the structure is needed, and very likely two planarization steps is needed for Ge on Si to ensure high quality material.

Although the present invention has been shown and described with respect to several preferred embodiments thereof, various changes, omissions and additions to the form and detail thereof, may be made therein, without departing from the spirit and scope of the invention.

What is claimed is:

1. A method of fabricating a semiconductor structure comprising:
    providing a semiconductor substrate;
    providing at least one first crystalline epitaxial layer on said substrate, including growing a GeSi relaxed graded region on said substrate; and
    planarizing the surface of said first layer.

2. The method of claim 1 further comprising providing at least one second crystalline epitaxial layer on said first layer.

3. The method of clam 1 further comprising incorporating compressive strain in said graded region to offset tensile stain incorporated during thermal processing.

4. The method of claim 3, wherein said step of incorporating compressive strain comprises decreasing the growth temperature as Ge concentration increases in said graded region.

5. The method of claim 4, wherein said step of incorporating compressive strain comprises growing alloys of $Ge_xSi_{1-x}$ from x=0 to about x≈35% at 750° C., growing alloys from x=35 to about x≈75% at between 650° C. and 750° C., and growing alloys greater than 75% at 550° C.

6. The method of claim 1, wherein said step of planarizing comprises chemical-mechanical polishing.

7. A method of fabricating a semiconductor structure comprising:
    providing a semiconductor substrate;
    providing at least one lattice mismatched epitaxial layer on said substrate by growing a GeSi relaxed graded region on said substrate; and
    planarizing the surface of said layer.

8. The method of claim 7 further comprising providing at least one second crystalline epitaxial layer on said layer.

9. The method of claim 7 further comprising incorporating compressive strain in said graded region to offset tensile strain incorporated during thermal processing.

10. The method of claim 9, wherein said step of incorporating compressive strain comprises decreasing the growth temperature as Ge concentration increases in said graded region.

11. The method of claim 10, wherein said step of incorporating compressive strain comprises growing alloys of $Ge_xSi_{1-x}$ from x=0 to about x≈35% at 750° C., growing alloys from x=35 to about x≈75% at between 650° C. and 750° C., and growing alloys greater than 75% at 550° C.

12. The method of claim 7, wherein said step of planarizing comprises chemical-mechanical polishing.

13. The method of claim 7, wherein said layer is partially relaxed.

14. The method of claim 7, wherein said layer is fully relaxed.

15. A method of fabricating a semiconductor structure comprising:
    providing a semiconductor substrate;
    providing at least one lattice mismatched epitaxial layer on said substrate; and
    planarizing the surface of said layer by chemical-mechanical polishing.

16. A method of fabricating a semiconductor structure comprising:
    providing a semiconductor substrate;
    providing at least one lattice mismatched epitaxial layer on said substrate, said layer being partially relaxed; and
    planarizing the surface of said layer.

17. A method of fabricating a semiconductor structure comprising:
    providing a semiconductor substrate;
    providing at least one lattice mismatched epitaxial layer on said substrate, said layer being fully relaxed; and
    planarizing the surface of said layer.

* * * * *

UNITED STATES PATENT AND TRADEMARK OFFICE
CERTIFICATE OF CORRECTION

| | |
|---|---|
| PATENT NO. | : 6,291,321 B1 |
| APPLICATION NO. | : 09/265016 |
| DATED | : September 18, 2001 |
| INVENTOR(S) | : Eugene A. Fitzgerald |

It is certified that error appears in the above-identified patent and that said Letters Patent is hereby corrected as shown below:

Column 4, line 42, replace "50-100%" with --50-76%--.

Signed and Sealed this

Eighth Day of July, 2008

JON W. DUDAS
*Director of the United States Patent and Trademark Office*